United States Patent
Lee et al.

(10) Patent No.: US 7,638,423 B2
(45) Date of Patent: Dec. 29, 2009

(54) SEMICONDUCTOR DEVICE AND METHOD OF FORMING WIRES OF SEMICONDUCTOR DEVICE

(75) Inventors: Jung-eun Lee, Seoul (KR); Young-jin Wee, Seongnam-si (KR); Andrew-tae Kim, Yongin-si (KR); Young-joon Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 13 days.

(21) Appl. No.: 11/701,420

(22) Filed: Feb. 2, 2007

(65) Prior Publication Data

US 2007/0224855 A1      Sep. 27, 2007

(30) Foreign Application Priority Data

Feb. 3, 2006      (KR)      ............. 10-2006-0010637

(51) Int. Cl.
*H01L 21/4763*      (2006.01)
(52) U.S. Cl. .................... 438/622; 257/E23.145
(58) Field of Classification Search .......... 438/622, 438/626–629, 637–645, 700, 703; 257/E21.579, 257/E23.145
See application file for complete search history.

(56) References Cited

U.S. PATENT DOCUMENTS

| | | | | |
|---|---|---|---|---|
| 5,966,634 | A  * | 10/1999 | Inohara et al. | 438/687 |
| 6,380,075 | B1 * | 4/2002  | Cabral et al.  | 438/637 |
| 7,049,226 | B2 * | 5/2006  | Chung et al.   | 438/648 |
| 7,262,133 | B2 * | 8/2007  | Chen et al.    | 438/653 |
| 7,332,428 | B2 * | 2/2008  | Beck           | 438/637 |

FOREIGN PATENT DOCUMENTS

| JP | 2004-356500 | 12/2004 |
|----|-------------|---------|
| KR | 1020030002137 A | 1/2003 |
| KR | 1020050040552 A | 5/2005 |

* cited by examiner

*Primary Examiner*—David Vu
(74) *Attorney, Agent, or Firm*—Harness, Dickey & Pierce, P.L.C.

(57) ABSTRACT

A method of forming wires of a semiconductor device including forming a first metal wire on a semiconductor substrate; forming a first insulating film on the first metal wire; etching a portion of the first insulating film to expose a surface portion of the first metal wire; forming a first barrier metal film on sidewalls of the opening and the exposed first metal wire; etching a portion of the first barrier metal film on the first metal wire to expose a surface portion of the first metal wire; performing a heat treatment process on the exposed surface portion of the first metal wire to improve surface roughness; and forming a second wire by filling the opening using a conductive material.

19 Claims, 5 Drawing Sheets

SEMICONDUCTOR DEVICE AND METHOD OF FORMING WIRES OF SEMICONDUCTOR DEVICE

PRIORITY STATEMENT

This U.S. non-provisional application claims the benefit of priority from Korean Patent Application No. 10-2006-0010637, filed on Feb. 3, 2006, in the Korean Intellectual Property Office (KIPO), the disclosure of which is incorporated herein in its entirety by reference.

BACKGROUND

1. Field

Example embodiments relate to a method of forming wires of a semiconductor device, for example, a method of forming wires of a semiconductor device in which a heat treatment process may be applied to a damascene structure wire to increase the reliability of the wire.

2. Description of the Related Art

As semiconductor devices become more highly integrated and are required to operate at higher speeds, metal wire structures having a lower resistance may be needed. For example, as the integration density of semiconductor devices increases, the structure of the metal wire may become more complicated.

Thus, a multiple metal wire structure may be used in which metal lines may be stacked in multiple layers. A metal having lower resistance may be required to form electric wires having a fine line width without degrading a response speed, and the wiring may be formed in a multilayer structure to increase integration density.

Of the metals having a lower resistance, copper may be used to replace a conventional metal wire formed of aluminum. However, copper may not be readily patterned by photolithography and etching processes. Accordingly, a damascene process in which, after copper may be buried in a via hole and a trench using a plating method, a via plug and a metal line may be formed by planarizing the resultant product.

In a conventional damascene metal wire process, a barrier metal film may be formed to prevent a metal wire from being diffused into an inter-insulating film after a via hole and trench are formed. The barrier metal film may be a nitride metal film formed of TaN, TiN, etc. However, the nitride metal film may have a specific resistance larger than a pure metal film. Therefore, the nitride metal film may increase a contact resistance between the via plug and the metal wire, and may degrade the response speed of the semiconductor device. Accordingly, after forming the barrier metal film, a process of removing or minimizing the thickness of the barrier metal film in a region where the via plug contacts the metal wire may be applied to reduce the contact resistance between the via plug and the metal wire. The barrier metal film removed from the contact region may be deposited on a sidewall of the via plug and may be formed into a barrier metal spacer.

However, the process of forming the barrier metal spacer by etching the barrier metal film may expose the metal wire below the barrier metal film, and etching damage may occur on an exposed surface of the metal wire. Thus, the surface roughness of the metal wire may be increased. If the roughness of the surface of the metal wire is increased, electro-migration of the metal wire by electrical stress may be accelerated, which may result in the generation of voids in the contact of the metal wire in a short period of time near.

FIG. 1 illustrates a vertical-scanning electron microscopy (V-SEM) image of a cross-section of a metal wire formed using a conventional technique after electrical stress is applied to the metal wire. Referring to FIG. 1, a void 10 may be generated in a metal wire below a region where a contact between the via plug and the metal wire may be formed. The void 10 may be generated due to the electro-migration of the metal wire, and may reduce the reliability of the wire.

SUMMARY

Example embodiments may provide a method of forming wires of a semiconductor device by applying a heat treatment process to a damascene wire structure to increase the reliability of the wire.

In an example embodiment, a method of forming wires of a semiconductor device may include forming a first metal wire on a semiconductor substrate; forming a first insulating film on the first metal wire; etching a portion of the first insulating film to form an opening that may expose a surface portion of the first metal wire; forming a first barrier metal film on sidewalls of the opening and the exposed first metal wire; etching a portion of the first barrier metal film on the first metal wire to expose a surface portion of the first metal wire; performing a heat treatment process on the exposed surface portion of the first metal wire; and forming a second metal wire by filling the opening using a conductive material.

According to an example embodiment, the method may include forming a first barrier metal film on sidewalls of the opening.

According to an example embodiment, the method may include forming a second barrier metal film in the opening.

According to an example embodiment, the method may include etching a portion of the first barrier metal film on the first metal wire. The heat treatment process may be performed without a vacuum breakdown in the same facility that a portion of the first barrier metal film is etched.

According to an example embodiment, the method may include etching a portion of the first barrier metal film on the first metal wire. The etching may be performed under a plasma atmosphere including at least one of argon and nitrogen.

According to an example embodiment, the heat treatment process may be performed in a temperature range of about 50 to 400° C.

According to an example embodiment, the etching of a portion of the first insulating film may include forming a via hole exposing the first metal wire; and forming a trench crossing an upper part of the via hole. At least a portion of the trench may be connected to the via hole.

In an example embodiment, a semiconductor device may include a heat treated first metal wire formed on a semiconductor substrate; a first insulating layer formed on the first metal wire; a via plug formed in the first insulating layer contacting the first metal wire; a second metal wire crossing an upper part of the via plug, at least a portion of the second metal wire contacting the via plug; and a first metal spacer formed between the first insulating layer and the sidewalls of the via plug and second metal wire.

According to an example embodiment, a second barrier metal film may be formed in the opening of the first insulating layer, covering the first metal spacer and the exposed surface portion of the first metal wire.

According to an example embodiment, an etch stopper film may be formed between the first metal wire and the first insulating film having an opening exposing at least a portion of the first metal wire.

According to an example embodiment, a hard mask layer may be formed on the first insulating film having an opening exposing the first metal wire.

According to an example embodiment, the first metal wire may be formed in a second insulating film that is formed on the semiconductor substrate.

According to an example embodiment, a second barrier metal film may be interposed between the second insulating film and the semiconductor substrate.

BRIEF DESCRIPTION OF THE DRAWINGS

Example embodiments will be described with reference to the accompanying drawings.

DESCRIPTION OF EXAMPLE EMBODIMENTS

Figure 1:
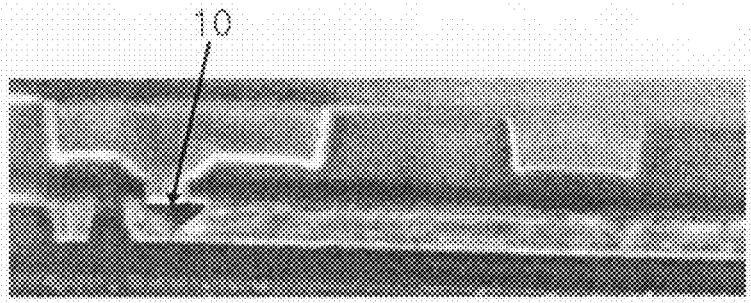
FIG. 1 illustrates a vertical-scanning electron microscopy (V-SEM) image illustrating a wire structure of a conventional semiconductor device.

Example embodiments will now be described more fully with reference to the accompanying drawings. Example embodiments may, however, be embodied in many different forms and should not be construed as being limited to the example embodiments set forth herein. Rather, these example embodiments are provided so that this disclosure will be thorough, and will fully convey the scope to those skilled in the art. Accordingly, well known processes, well known device structures, and well known techniques are not specifically described to avoid a vague interpretation of the example embodiments. Like reference numerals refer to like elements through the drawings.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A through 2H are cross-sectional views illustrating a method of forming wires of a semiconductor device according to an example embodiment.

Figure 2A:
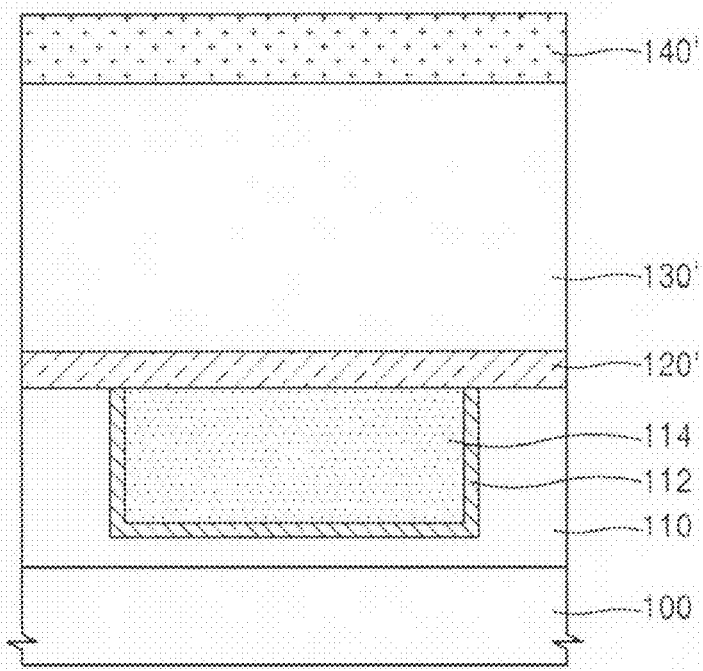
FIGS. 2A through 2H are cross-sectional views illustrating a method of manufacturing a semiconductor device according to an example embodiment.

Referring to FIG. 2A, a first inter-layer insulating layer 110 may be formed on a semiconductor substrate 100. A first metal film (not shown) may be formed on a first inter-layer insulating layer 110 to form a lower metal wire 114. At least a portion of the lower metal wire 114 may be buried in the first inter-layer insulating layer 110.

A lower barrier metal film 112 may be interposed between the lower metal wire 114 and the first inter-layer insulating layer 110.

A transistor (not shown) or storage nodes (not shown) may be formed in or on the semiconductor substrate 100. The lower metal wire 114 may be connected to the transistor or the storage nodes.

An additional lower metal wire (not shown) may be formed on the semiconductor substrate 100 below the lower metal wire 114. For example, the lower metal wire 114 may be connected to the additional lower metal wire.

An etch stopper layer 120' may be formed on the lower metal wire 114 and the first inter-layer insulating layer 110 as necessary. The etch stopper layer 120' may serve as a diffusion prevention film of the lower metal wire 114. The etch stop layer 120' may be formed of a different material than the first inter-layer insulating layer 110 at an interface between the etch stopper layer 120' and the first inter-layer insulating layer 110. A second metal etching prevention film, for example, a cobalt tungsten phosphorous (CoWP) layer, may be formed on the lower metal wire 114 to prevent the lower metal wire 114 from over etching. The CoWP layer may be selectively formed on the lower metal wire 114. A second inter-layer insulating layer 130' may be formed on the etch stopper layer 120'. If necessary, a hard mask film 140' may be formed on the second inter-layer insulating layer 130'.

For example, the etch stopper layer 120' may have a thickness of approximately 1000 Å or less. The second inter-layer insulating layer 130' may have a thickness of 2000 to 10000 Å. The hard mask film 140' may be formed using a chemical vapour deposition (CVD) method, and may include a silicon oxide film. The hard mask film 140' may have a thickness of 200 to 1500 Å.

Figure 2B:
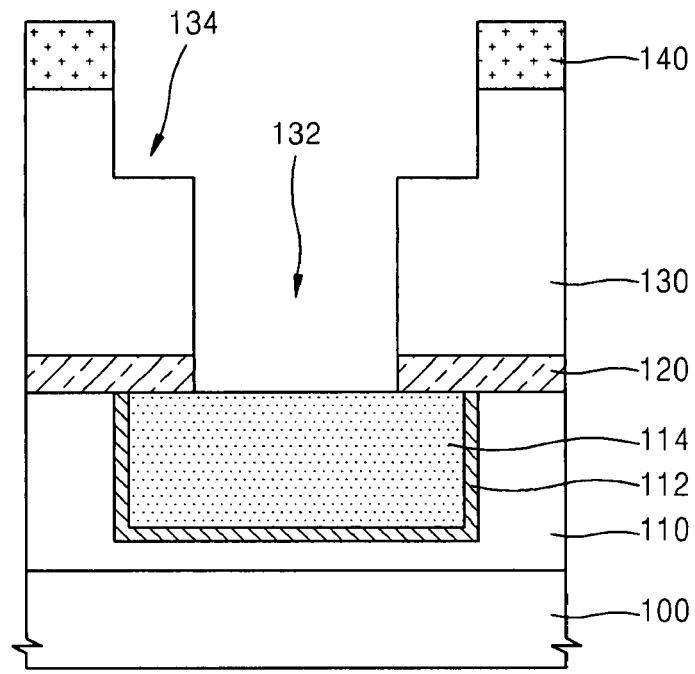

Referring to FIG. 2B, a second inter-layer insulating film 130 that may include a via hole 132 and a trench 134 may be formed by etching a portion of the second inter-layer insulating layer 130'. For example, a first hard mask pattern (not shown) may be formed by patterning the hard mask film (shown as 140' in FIG. 2A) using photolithography and etching techniques. The via hole 132 that may expose the etch stopper layer (shown as 120' in FIG. 2A) may be formed by etching the second inter-layer insulating layer 130' using the first hard mask pattern as an etching protection film. A second hard mask pattern 140 may be formed by patterning the first hard mask pattern (not shown). The trench 134 that may cross over the via hole 132 may be formed by partially etching the second inter-layer insulating film 130 using the second hard mask pattern 140 as an etching protection film. An etch stopper pattern 120 may be formed by etching a portion of the etch stopper layer 120' to expose a portion of the lower metal wire 114.

According to another example embodiment, the sequence of forming the via hole 132 and the trench 134 may be reversed.

Figure 2C:
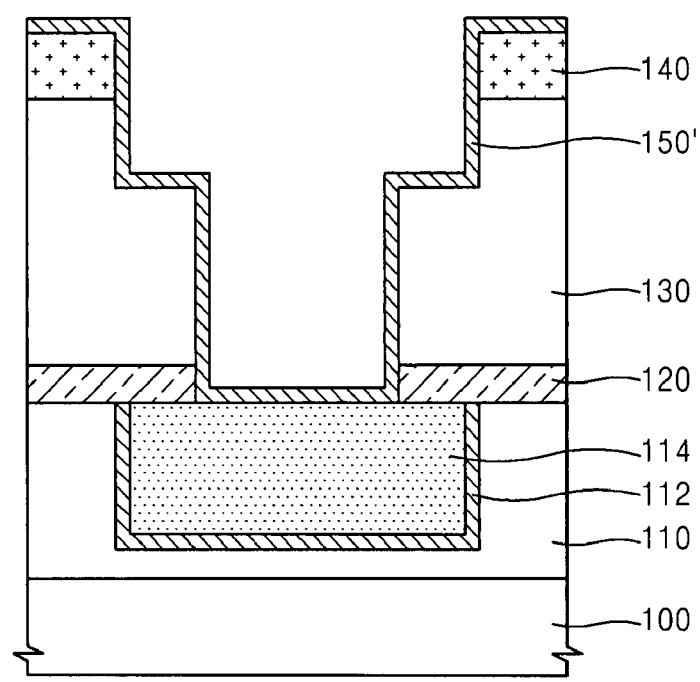

Referring to FIG. 2C, a first barrier metal layer 150' may be formed on the resultant product in which the via hole 132 and the trench 134 may be formed. For example, the first barrier metal layer 150' may be formed by a physical vapour deposition (PVD) method, a CVD method, an atomic layer deposition (ALD) method, etc., and may be formed of Ta, TaN, Ti, TiN, W, WN, Ru, Hf, or a composite of these metals. For example, the first barrier metal layer 150' may be formed to a thickness of approximately 500 Å or less.

Figure 2D:
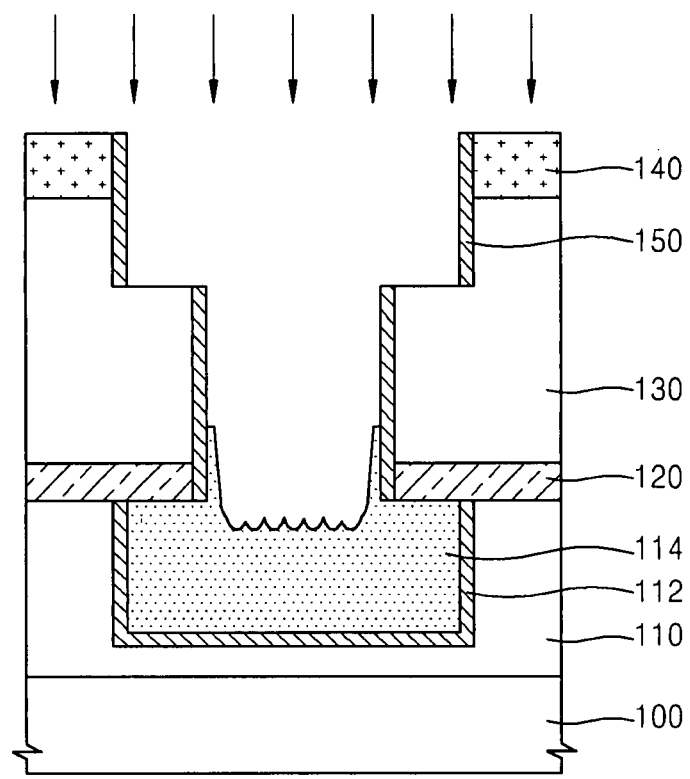

Referring to FIG. 2D, a first barrier metal spacer 150 may be formed and a portion of the lower metal wire 114 may be exposed to reduce a contact resistance of a via plug (not shown) and the lower metal wire 114 by anisotropically etching the first barrier metal layer 150'. The anisotropic etching of the first barrier metal layer 150' may be performed using the same process used to form the first barrier metal layer 150' or by an etching process using plasma. If the anisotropic etching of the first barrier metal layer 150' is performed using the same process used to form the first barrier metal layer 150', an RF re-sputtering may be performed without a vacuum breakdown after the first barrier metal layer 150' is formed. If plasma is generated after applying a positive voltage to the semiconductor substrate 100, the first barrier metal spacer 150, but not the first barrier metal spacer 150 formed on the sidewalls of the second inter-layer insulating film 130, may be removed due to the effect of RF re-sputtering caused by the plasma.

For example, if the first barrier metal layer 150' is formed using a PVD method, first barrier metal spacer 150 may be weaker because there may have been poor step coverage. If the first barrier metal layer 150' is formed of TaN, the TaN film on the surface of the lower metal wire 114 may be removed through an RF TaN re-sputtering. This process may remove the TaN film on the surface of the lower metal wire 114 while reinforcing the first barrier metal spacer 150.

For example, if plasma is used to etch the first barrier metal layer 150', the surface of the lower metal wire 114 may be damaged resulting in surface roughness of the first barrier metal layer 150'. If the lower metal wire 114 has a higher surface roughness, the reliability of the semiconductor device may be reduced.

Figure 2E:
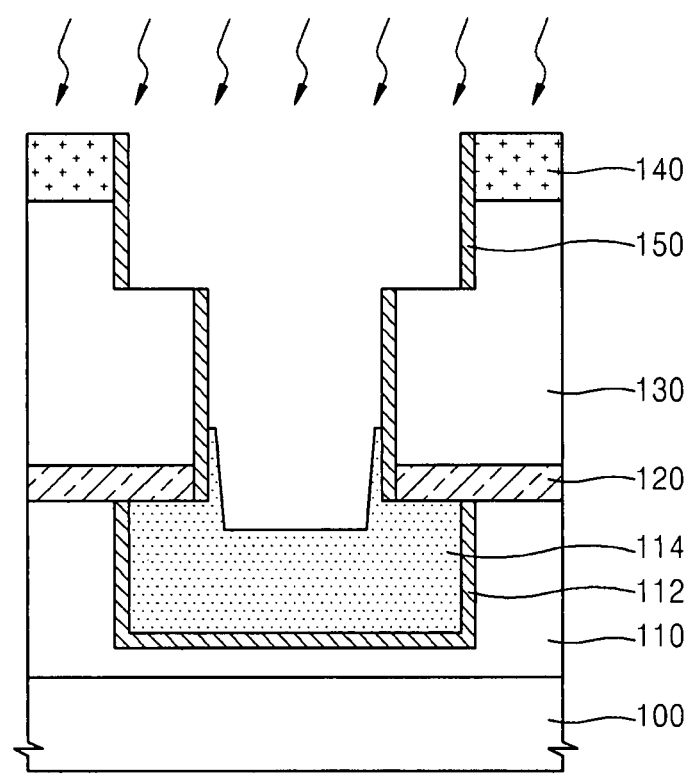

Referring to FIG. 2E, in order to reduce the surface roughness of the lower metal wire 114, a heat treatment process may be performed. The heat treatment process may include a rapid treatment process or a furnace process under a non-oxygen atmosphere, for example, argon, nitrogen, hydrogen, helium, ammonia, a composite of these gases, or under a vacuum. The heat treatment process may be performed without a vacuum breakdown in the same way that the first barrier metal spacer 150 may be formed. The heat treatment process may be performed in a temperature range of about 50 to 400° C. If the lower metal wire 114 is formed of copper and the heat treatment process temperature exceeds about 400° C., the contact resistance may increase since the exposed region may be oxidized. If the heat treatment process is performed at a lower temperature below about 50° C., an effect of reducing the surface roughness of the lower metal wire 114 may be reduced.

Figure 2F:
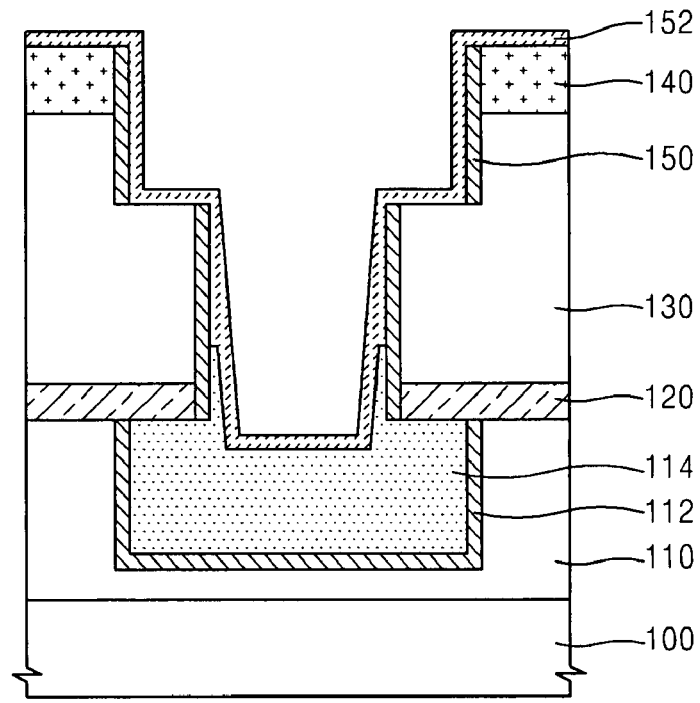

Referring to FIG. 2F, a second barrier metal film 152 may be formed on the resultant product of the heat treatment process. The second barrier metal film 152 may be formed of, for example, Ta, TaN, Ti, TiN, W, WN, Ru, Hf, or a composite of these metals. For example, the second barrier metal film 152 may be formed to a thickness of about 500 Å or less. The second barrier metal film 152 may be formed using a physical vapour deposition (PVD) method, a chemical vapour deposition (CVD) method, an atomic layer deposition (ALD) method, etc.

Figure 2G:
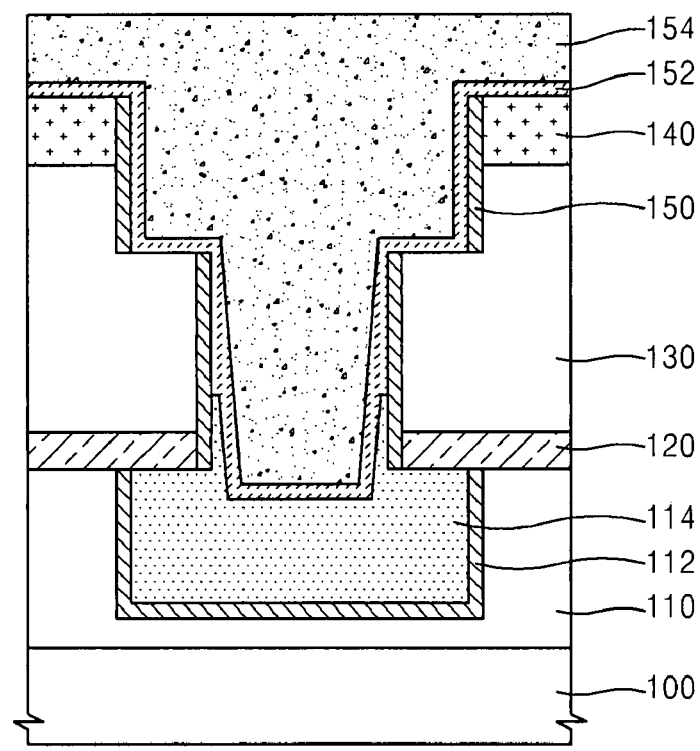

Referring to FIG. 2G, a second metal film 154 may be formed on the second barrier metal film 152. For example, the second metal film 154 may be formed by forming a copper plating layer (not shown) on a seed layer (not shown). The seed layer may be formed of copper using the PVD method, a CVD method, an ALD method, etc. The copper plating layer may be formed by electroplating or electroless plating.

Figure 2H:
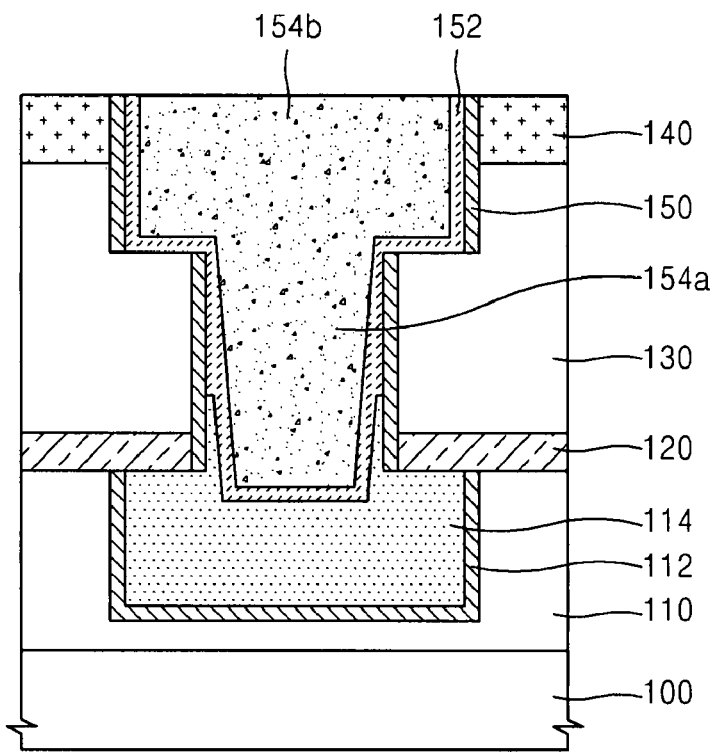

Referring to FIG. 2H, a via plug 154a and an upper metal wire 154b may be formed by planarizing the second barrier metal film 152 and the second metal film 154 until the hard mask film 140 may be exposed. For example, planarizing may be performed using a chemical mechanical polishing (CMP) method. The formation of the via plug 154a and the upper metal wire 154b by burying and planarizing is called a damascene method, for example, the formation of the via plug 154a and the upper metal wire 154b can be called a dual damascene method because the via plug 154a and the upper metal wire 154b may be formed simultaneously.

However, the method of forming the wires of a semiconductor device according to an example embodiment is not limited to the dual damascene method. It should be understood by those of ordinary skilled in the art that a method of forming wires of a semiconductor device according to an example embodiment may be a single damascene method in which only one of a via plug 154a and the upper metal wire 154b may be formed at a time.

Figure 3:
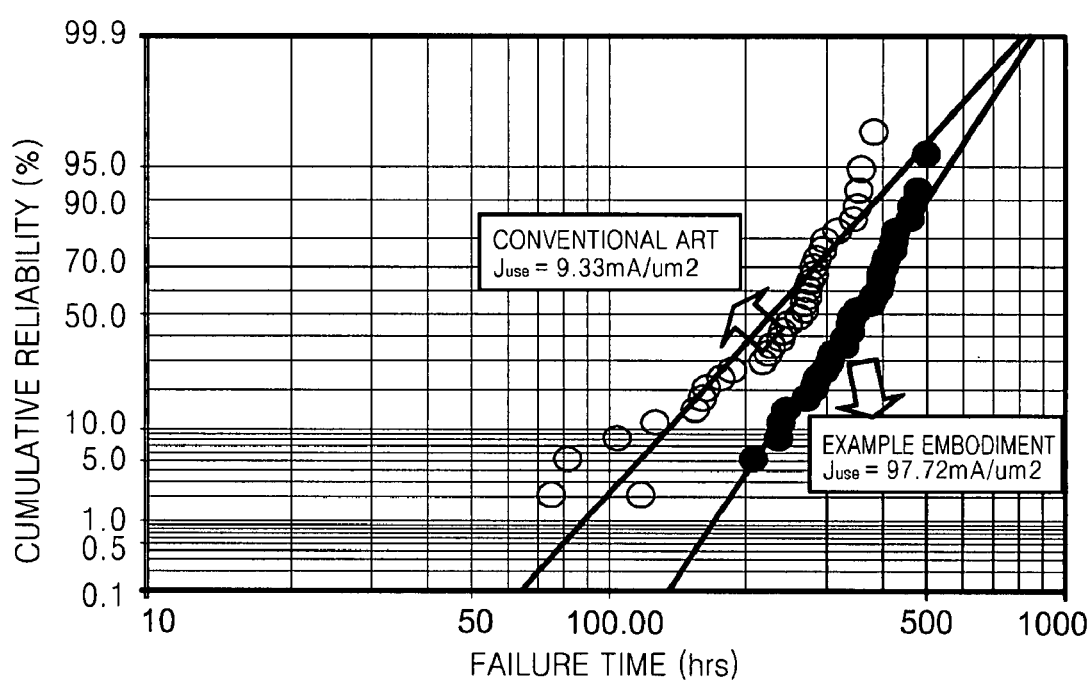
FIG. 3 is a graph illustrating a wire reliability comparison between a conventional wire and a wire according to an example embodiment.

FIG. 3 is a graph showing a wire reliability comparison between a wire of a conventional semiconductor and a wire of a semiconductor device according to an example embodiment. The horizontal axis of the graph represents failure time (in hours) until a failure occurs, and the vertical axis represents the percentage of cumulative reliability with respect to the number of failures according to the number of samples. The heat treatment process was performed at a temperature of about 200° C. for 120 seconds under a nitrogen atmosphere. A maximum current density ($J_{use}$) of the wire of the conventional semiconductor device that has not been heat treated after forming the first barrier metal spacer is 9.33 mA/$\mu$m$^2$, but the maximum current density ($J_{use}$) of the wire that has been heat treated according to an example embodiment is 97.72 mA/$\mu$m$^2$. For example, the wire of a semiconductor device according to an example embodiment may have a reliability that is about 10 times greater than a conventional wire.

As described above, reducing the surface roughness of the wire through a heat treatment process to a damascene structure wire may increase reliability of the wire of a semiconductor device.

While example embodiments have been particularly shown and described, it will be understood by those of ordinary skill in the art that various changes in form and details may be made therein without departing from the spirit and scope as defined by the following claims.

What is claimed is:

1. A method of forming wires of a semiconductor device, comprising:
    forming a first metal wire on a semiconductor substrate;
    forming a first insulating film on the first metal wire;
    etching a portion of the first insulating film to form an opening that exposes a surface portion of the first metal wire;
    forming a first barrier metal film on sidewalls of the opening and the exposed first metal wire;
    etching a portion of the first barrier metal film on the first metal wire to expose a surface portion of the first metal wire;
    performing a heat treatment process on the exposed surface portion of the first metal wire after the portion of the first barrier metal film has been removed, the heat treatment process being performed without a vacuum breakdown using a same facility as used for etching the portion of the first barrier metal film; and
    forming a second metal wire by filling the opening using a conductive material.

2. The method of claim 1, wherein the heat treatment process is performed in a temperature range of about 50 to 400° C.

3. The method of claim 2, wherein the heat treatment process is performed under a gas atmosphere of at least one of argon, hydrogen, helium, nitrogen, ammonia, argon, and a vacuum.

4. The method of claim 1, wherein the etching of a portion of the first barrier metal film is performed under a plasma atmosphere including at least one of argon and nitrogen.

5. The method of claim 1, wherein the first barrier metal film is formed of at least one of Ta, TaN, Ti, TiN, W, WN, Ru, Hf.

6. The method of claim 1, wherein the first barrier metal film is formed to a thickness of about 500 Å or less.

7. The method of claim 1, further comprising forming a second barrier metal film in the opening.

8. The method of claim 7, wherein the second barrier metal film is formed of at least one of Ta, TaN, Ti, TiN, W, WN, Ru, Hf.

9. The method of claim 7, wherein the second barrier metal film is formed to a thickness of about 500 Å or less.

10. The method of claim 1, further comprising forming an etch stopper film between the first metal wire and the first insulating film.

11. The method of claim 10, wherein the etching of a portion of the first insulating film to expose a portion of the first metal wire includes etching the etch stopper film.

12. The method of claim 1, wherein the etching of a portion of the first insulating film includes:
    forming a via hole exposing the first metal wire; and
    forming a trench crossing an upper part of the via hole, at least a portion of the trench is connected to the via hole.

13. The method of claim 1, further comprising forming a hard mask layer on the first insulating film.

14. The method of claim 13, wherein the etching of a portion of the first insulating film to expose a portion of the first metal wire includes etching the hard mask layer.

15. The method of claim 1, wherein the first metal wire is formed in a second insulating film formed on the semiconductor substrate.

16. The method of claim 15, wherein a second barrier metal film is interposed between the second insulating film and the semiconductor substrate.

17. The method of claim 1, further comprising forming a third metal wire on the semiconductor substrate below the first metal wire, the third metal wire being electrically connected to the first metal wire.

18. The method of claim 1, wherein the first metal wire includes copper.

19. The method of claim 1, wherein the second metal wire includes copper.

* * * * *